(12) United States Patent
Sa et al.

(10) Patent No.: US 8,599,294 B2
(45) Date of Patent: Dec. 3, 2013

(54) PIXEL, PIXEL ARRAY, IMAGE SENSOR INCLUDING THE SAME AND METHOD FOR OPERATING THE IMAGE SENSOR

(75) Inventors: Seung Hoon Sa, Seoul (KR); Woon Il Choi, Seoul (KR); Seong Hyung Park, Seoul (KR); Chun Hee Jeong, Seoul (KR); Dong Hyuk Park, Seoul (KR); Cheong Yong Park, Seoul (KR); Jung Chan Kyoung, Seoul (KR); Jung Wan Jeong, Seoul (KR); Dong Gyu Lee, Seoul (KR); Jong Min You, Seoul (KR); Hyun Jong Ji, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 270 days.

(21) Appl. No.: 13/097,704

(22) Filed: Apr. 29, 2011

(65) Prior Publication Data

US 2012/0257093 A1 Oct. 11, 2012

(30) Foreign Application Priority Data

Apr. 11, 2011 (KR) .......................... 10-2011-0033466

(51) Int. Cl.
  *H04N 5/335* (2011.01)
(52) U.S. Cl.
  USPC ........................... 348/308; 348/372; 348/294

(58) Field of Classification Search
  USPC ......... 348/308, 294, 372; 250/208.1; 257/292
  See application file for complete search history.

(56) References Cited

U.S. PATENT DOCUMENTS

| | | | |
|---|---|---|---|
| 6,977,363 B2 * | 12/2005 | Kokubun | 250/208.1 |
| 7,531,858 B2 * | 5/2009 | Lee | 257/292 |
| 2008/0012973 A1 | 1/2008 | Park et al. | |
| 2011/0298956 A1 * | 12/2011 | Giffard et al. | 348/308 |
| 2012/0033118 A1 | 2/2012 | Lee et al. | |

FOREIGN PATENT DOCUMENTS

| | | |
|---|---|---|
| KR | 10-0379017 B1 | 4/2003 |
| KR | 10-2004-0093947 A | 11/2004 |
| KR | 10-0523672 B1 | 10/2005 |
| KR | 10-0782308 B1 | 12/2007 |
| KR | 10-2010-0104074 A | 9/2010 |

* cited by examiner

*Primary Examiner* — Tuan Ho
(74) *Attorney, Agent, or Firm* — Saliwanchik, Lloyd & Eisenschenk

(57) ABSTRACT

Disclosed are a pixel, a pixel array, an image sensor including the pixel array and a method for operating the image sensor. The pixel includes a photo-electro conversion unit; a first capacitor for storing a first quantity of charges of the photo-electro conversion unit; a second capacitor for storing a second quantity of charges of the photo-electro conversion unit; and an output unit to output the first and second quantities of the charges.

16 Claims, 2 Drawing Sheets

PIXEL, PIXEL ARRAY, IMAGE SENSOR INCLUDING THE SAME AND METHOD FOR OPERATING THE IMAGE SENSOR

CROSS-REFERENCE TO RELATED APPLICATION

This application claims the benefit under 35 U.S.C. §119 of Korean Patent Application No. 10-2011-0033466, filed on Apr. 11, 2011, which is hereby incorporated by reference in its entirety.

BACKGROUND

The embodiment relates to a pixel, a pixel array, an image sensor including the same and a method for operating the image sensor.

A dynamic range is one of important factors to determine the quality of an image sensor. In general, the dynamic range refers to the maximum range for processing signals without distorting input signals. In the case of the image sensor, images having the superior quality can be obtained as the dynamic range becomes widened regardless of the brightness variation.

However, according to the color image sensor of the related art, the dynamic range is so narrow that the original color of the image may not be expressed well when one of red, green and blue colors is saturated. In order to solve the problem caused by the narrow dynamic range, a WDR (wide dynamic range) pixel has been suggested.

First, there has been suggested a method of realizing the WDR operation by adjusting irradiation time of the light in the image sensor of the related art.

Second, there has been suggested a method of providing an additional capacitor to change FD (floating diffusion) capacity, in which a pixel structure includes a transistor to adjust the additional capacitor so that overflow charges, which are generated from a PD (photodiode) under the high intensity of illumination as light intensity is increased, can be stored in the additional capacitor.

Third, there has been suggested a method of providing a WDR pixel, in which two PDs are installed in one pixel such that charges generated from the two PDs are combined with each other.

However, according to the first method, the sensitivity is constant regardless of the variation of light intensity (that is, high intensity of illumination and low intensity of illumination), so that the image may be darkened under the low intensity of illumination. In addition, while the pixel is being operated, the timing adjustment for the pixel operation under the high intensity of illumination may be limited.

Further, in the case of the second method for improving the sensitivity according to the light intensity by using the additional capacitor and the transistor and the third method for driving two PDs installed in one pixel, the fill factor in the pixel may be reduced.

BRIEF SUMMARY

The embodiment provides a pixel capable of improving the sensitivity while maintaining the high fill factor, a pixel array, an image sensor including the same and a method for operating the image sensor.

A pixel according to the embodiment may include a photo-electro conversion unit; a first capacitor for storing a first quantity of charges of the photo-electro conversion unit; a second capacitor for storing a second quantity of charges of the photo-electro conversion unit; and an output unit to output the first and second quantities of the charges.

A pixel array according to the embodiment may include the pixel in the form of an array.

An image sensor according to the embodiment may include the pixel array.

According to the embodiment, there is provided a method for operating an image sensor including a photo-electro conversion unit, a first capacitor for storing a first quantity of charges of the photo-electro conversion unit, a second capacitor for storing a second quantity of charges of the photo-electro conversion unit, and an output unit to output the first and second quantities of the charges, in which the method may include the step of controlling the first and second capacitors independently from each other.

The embodiment can provide a pixel capable of improving the sensitivity while maintaining the high fill factor, a pixel array, an image sensor including the same and a method for operating the image sensor.

For instance, according to the embodiment, although one photodiode PD is provided to receive the light, two floating diffusion regions FD having different capacitances are provided to read the voltage of the photodiode PD. Thus, even if the same charges are generated in the photodiode PD through the light irradiation, voltage difference may occur when the charges are transferred to the floating diffusion regions FD due to the differential capacitance, so that various gains are obtained.

Therefore, according to the embodiment, the gain is increased under the low intensity of illumination because the signal is read in the floating diffusion region FD having the lower FD capacitance so that the sensitivity is improved. In contrast, the gain is lowered under the high intensity of illumination because the signal is read in the floating diffusion region FD having the higher FD capacitance so that the sensitivity is reduced. Thus, the image can be realized under the very high intensity of illumination, so that it is possible to provide the pixel having the WDR characteristic, the pixel array, the image sensor, and the method for operating the image sensor.

In addition, different from the related art that provides two photodiodes PD in one pixel, according to the embodiment, one photodiode PD is provided in one pixel, so that the fill factor of the light receiving section can be relatively increased and the sensitivity can be improved.

DETAILED DESCRIPTION

Figure 1:
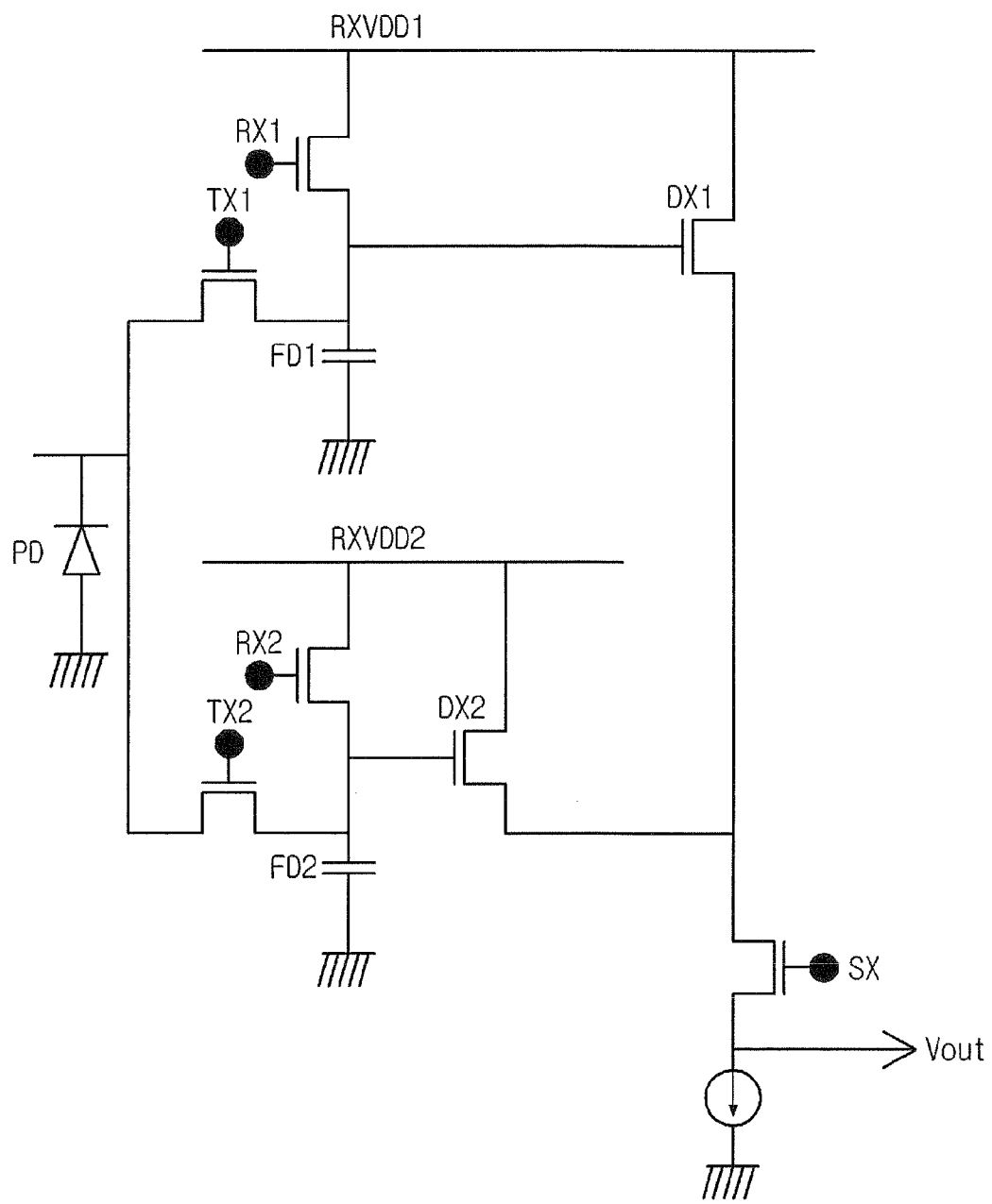
FIG. 1 is a circuit view of a pixel array according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a circuit view of a pixel array 100 according to the first embodiment.

The embodiment is applicable for a WDR (wide dynamic range) pixel, a pixel array and an image sensor including the pixel array, but the embodiment is not limited thereto.

A pixel, a pixel array and an image sensor including the pixel array according to the embodiment may include a photo-electro conversion unit, a first capacitor for storing first quantity of charges of the photo-electro conversion unit, a second capacitor for storing second quantity of charges of the photo-electro conversion unit, and an output unit to output the first quantity of the charges and the second quantity of the charges.

The photo-electro conversion unit may include a photodiode (PD), the first and second capacitors may include first and second floating diffusion regions (FD), and the output unit may include an output switching device, but the embodiment is not limited thereto.

In addition, according to the embodiment, the pixel array may include a first reset switching device connected to a first power supply to reset the first capacitor, and a second reset switching device connected to a second power supply, which is controllable independently from the first power supply, to reset the second capacitor. The first and second reset switching devices may include first and second reset transistors RX1 and RX2, respectively, but the embodiment is not limited thereto.

Further, according to the embodiment, the output unit may include a first output switching device electrically connected between the first capacitor and the first reset switching device to output the electric potential of the first capacitor and a second output switching device electrically connected between the second capacitor and the second reset switching device to output the electric potential of the second capacitor. The first output switching device is controlled by a first supply voltage and the second switching device is controlled by a second supply voltage.

The first and second output switching devices may include first and second drive transistors DX1 and DX2, respectively, but the embodiment is not limited thereto.

In addition, according to the embodiment, the pixel array may include a first transfer switching device for transferring the first quantity of the charges of the photo-electro conversion unit to the first capacitor and a second transfer switching device for transferring the second quantity of the charges of the photo-electro conversion unit to the second capacitor. The first capacitor is disposed between the first transfer switching device and the first reset switching device and the second capacitor is disposed between the second transfer switching device and the second reset switching device. The first and second transfer switching devices may include first and second transfer transistors TX1 and TX2, respectively, but the embodiment is not limited thereto.

For instance, the pixel array 100 and the image sensor including the pixel array 100 according to the embodiment may include the first transfer transistor TX1 for transferring the first quantity of the charges of the photodiode PD to the first floating diffusion region FD1 and the second transfer transistor TX2 for transferring the second quantity of the charges of the photodiode PD to the second floating diffusion region FD2.

According to the embodiment, the first and second floating diffusion regions FD1 and FD2 are provided in one photodiode PD to drive the WDR pixel and the first and second reset transistors RX1 and RX2 and the first and second drive transistors DX1 and DX2 are provided in the first and second floating diffusion regions FD1 and FD2, respectively, to control the first and second floating diffusion regions FD1 and FD2. In addition, one select transistor may be provided to select the pixel.

For instance, according to the embodiment, although one photodiode PD is provided to receive the light, two floating diffusion regions FD having different capacitances are provided to read the voltage of the photodiode PD. Thus, even if the same charges are generated in the photodiode PD through the light irradiation, voltage difference may occur when the charges are transferred to the floating diffusion regions FD due to the differential capacitance, so that various gains are obtained.

According to the embodiment, the first floating diffusion region FD1 may have a first capacitance and the second floating diffusion region FD2 may have a second capacitance higher than the first capacitance.

According to the embodiment, the charges are stored in the second floating diffusion region FD2, that is, the second capacitor, after the charges have been stored in the first floating diffusion region FD1, that is, the first capacitor.

According to the embodiment, the voltage of the first floating diffusion region FD1 may be controlled independently from the second floating diffusion region FD2.

To this end, the first reset transistor RX1 and the first drive transistors DX1 are electrically connected to the first floating diffusion region FD1. In addition, a first power supply line RXVDD1 is connected to the first floating diffusion region FD1 and a second power supply line RXVDD2, which is controllable independently from the first power supply line RXVDD1, is connected to the second floating diffusion region FD2.

In addition, the second reset transistor RX2 and the second drive transistors DX2 are electrically connected to the second floating diffusion region FD2.

Further, according to the embodiment, the pixel array may include the select transistor SX electrically connected to the first reset transistor RX1, the first drive transistor DX1, the second reset transistor RX2 and the second drive transistor DX2.

According to the embodiment, the first power supply line RXVDD1 is electrically connected to the first reset transistor RX1 and the second power supply line RXVDD2 is electrically connected to the second reset transistor RX2.

In addition, according to the embodiment, if at least two photodiodes PD are shared, the number of the transfer transistors TX is twice as many as the number of the shared photodiodes PD. The number of the remaining transistors may not be changed.

Therefore, according to the embodiment, the gain is increased under the low intensity of illumination because the signal is read in the floating diffusion region FD having the lower FD capacitance so that the sensitivity is improved. In contrast, the gain is lowered under the high intensity of illumination because the signal is read in the floating diffusion region FD having the higher FD capacitance so that the sensitivity is reduced. Thus, the image can be realized under the very high intensity of illumination, so that it is possible to provide the pixel having the WDR characteristic, the pixel array, the image sensor, and the method for operating the image sensor.

In addition, different from the related art that provides two photodiodes PD in one pixel, according to the embodiment, one photodiode PD is provided in one pixel, so that the fill factor of the light receiving section can be relatively increased and the sensitivity can be improved.

Figure 2:
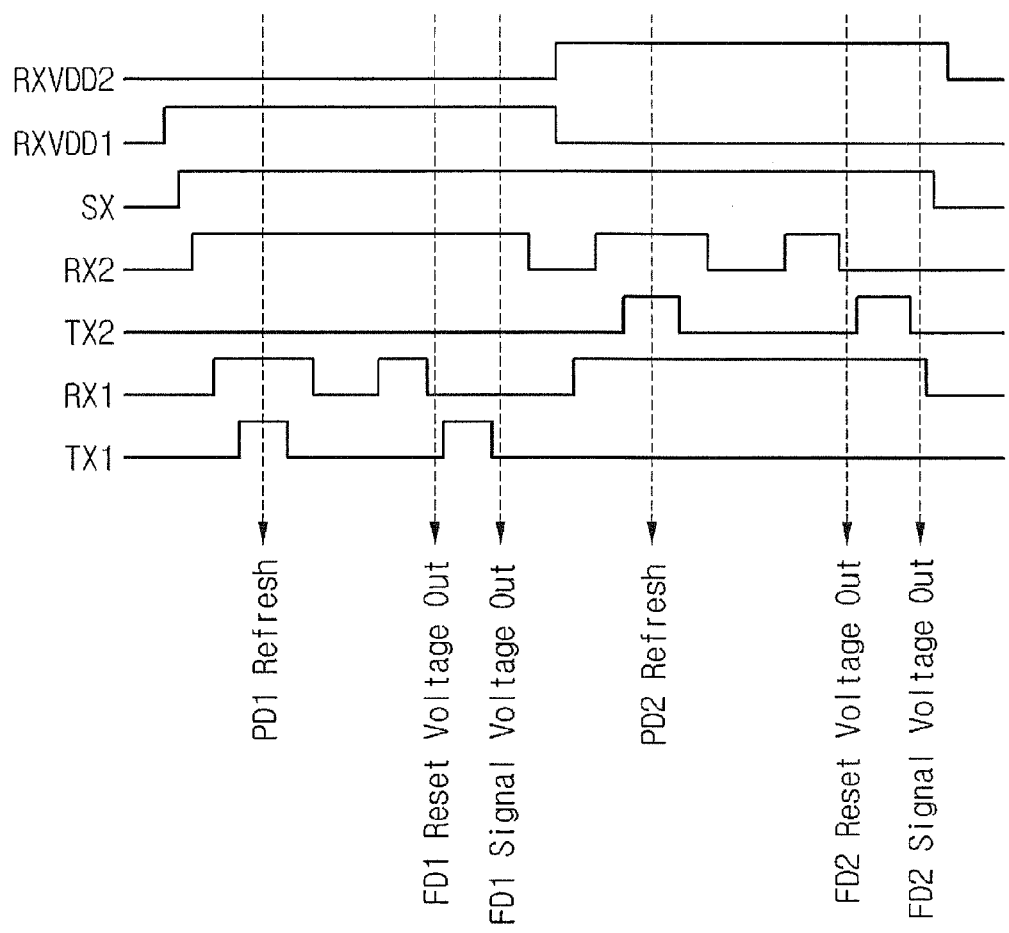
FIG. 2 is a timing diagram obtained from a circuit of a pixel array according to the embodiment.

FIG. 2 is a timing diagram obtained from a circuit of a pixel array according to the embodiment.

Hereinafter, the method for operating the pixel, the pixel array and the image sensor including the pixel array will be described with reference to FIGS. 1 and 2.

The method for operating the WDR image sensor includes the steps of reading out information about the first quantity of the charges generated in the photodiode PD from the first floating diffusion region FD1 having the first capacitance and reading out information about the second quantity of the charges generated in the photodiode PD from the second floating diffusion region FD2 having the second capacitance.

The second quantity of the charges is greater than the first quantity of the charges and the second capacitance is higher than the first capacitance.

According to the embodiment, the first and second floating diffusion regions FD1 and FD2 having capacitances different from each other are provided in one photodiode PD.

In addition, according to the embodiment, in order to independently control the voltage of the first and second floating diffusion regions FD1 and FD2, the first reset transistor RX1 and the first drive transistor DX1 are provided in the first floating diffusion region FD1 and the second reset transistor RX2 and the second drive transistor DX2 are provided in the second floating diffusion region FD2.

Further, according to the embodiment, in order to independently adjust the voltage of the first and second floating diffusion regions FD1 and FD2, the first power supply voltage line RXVDD1 is electrically connected to the first reset transistor RX1 and the second power supply voltage line RXVDD2 is electrically connected to the second reset transistor RX2.

According to the embodiment, although one photodiode PD is provided to receive the light, two floating diffusion regions FD having different capacitances are provided to store charge information of the photodiode PD. Thus, even if the same charges are generated in the photodiode PD through the light irradiation, voltage difference may occur when the charges are transferred to the floating diffusion regions FD due to the differential capacitance, so that various gains are obtained.

For instance, the information about the first quantity of the charges is read in the first floating diffusion region FD1 having the first capacitance so that the gain is increased and the sensitivity is improved.

Meanwhile, the information about the second quantity of the charges is read in the second floating diffusion region FD1 having the second capacitance so that the gain is lowered, thereby realizing the image having the WDR characteristic even under the high intensity of illumination.

Hereinafter, the method for operating the pixel, the pixel array and the image sensor including the pixel array as a function of operating time will be described with reference to FIGS. 1 and 2.

First, when one of the first and second floating diffusion regions FD1 and FD2 is operated, the other is maintained with the low voltage, that is, the other is turned off. Thus, according to the embodiment, the exposure time under the high intensity of illumination may be separated from the exposure time under the low intensity of illumination.

For instance, if the power supply line RXVDD1 of the first reset transistor is maintained with the high voltage, that is, the On voltage, and the power supply line RXVDD2 of the second reset transistor is maintained with the low voltage, that is, the Off voltage, the second floating diffusion region FD2 may not be operated when the first floating diffusion region FD1 is operated.

Then, as the first reset transistor TX1 is turned on, the electric potential of the first floating region FD1 becomes the applied voltage of the power supply line RXVDD1 of the first reset transistor TX1.

In addition, the first transfer transistor TX1 is turned on so that the photodiode region serving as the light receiving section is reset.

After that, the first transfer transistor TX1 is turned off and the light is incident into the photodiode PD, so that the charges are generated in the photodiode PD proportionally to the exposure time of the photodiode PD.

Then, after a predetermined time has elapsed, the turn on/off operation of the first reset transistor RX1 is performed to reset the first floating diffusion region FD1 before the first transfer transistor TX1 is turned on.

After that, as the first transfer transistor TX1 is turned on, the charges are transferred to the first floating diffusion region FD1 and the electric potential of the first floating diffusion region FD1 is converted proportionally to the quantity of the charges, so that the data are output to the column through the select transistor SX.

Subsequently, the second power supply line RXVDD2 of the second reset transistor is maintained with the high voltage and the first power supply line RXVDD1 of the first reset transistor is maintained with the low voltage, so that the second floating diffusion region FD2 is maintained with the high voltage and the first floating diffusion region FD1 is maintained with the low voltage.

After that, as the second reset transistor RX2 is turned on, the electric potential of the second floating region FD2 becomes the applied voltage of the second power supply line RXVDD2 of the second reset transistor TX2.

In addition, the second transfer transistor TX2 is turned on so that the photodiode region serving as the light receiving section is reset.

After that, the second transfer transistor TX2 is turned off and the light is incident into the photodiode PD, so that the charges are generated in the photodiode PD proportionally to the exposure time of the photodiode PD.

According to the embodiment, the exposure time can be reduced under the high intensity of illumination as compared with the exposure time under the low intensity of illumination, but the embodiment is not limited thereto. For instance, the high intensity of illumination refers to the charges having the code of 500 to 1000, but the embodiment is not limited thereto.

Then, after a predetermined time has elapsed, the turn on/off operation of the second reset transistor RX2 is performed to reset the second floating diffusion region FD2 before the second transfer transistor TX2 is turned on.

In addition, as the second transfer transistor TX2 is turned on, the charges are transferred to the second floating diffusion region FD2 and the electric potential of the second floating diffusion region FD2 is converted proportionally to the quantity of the charges, so that the data are output to the column through the select transistor SX.

According to the embodiment, the signal of the first floating diffusion region FD1 is combined with the signal of the second floating diffusion region FD2.

The embodiment is applicable when the pixel size is large, but the embodiment is not limited thereto.

Therefore, the embodiment can provide the pixel capable of improving the sensitivity while maintaining the high fill factor, the pixel array, the image sensor including the same and the method for operating the image sensor.

For instance, according to the embodiment, although one photodiode PD is provided to receive the light, two floating diffusion regions FD having different capacitances are provided to read the voltage of the photodiode PD. Thus, even if the same charges are generated in the photodiode PD through the light irradiation, voltage difference may occur when the charges are transferred to the floating diffusion regions FD due to the differential capacitance, so that various gains are obtained.

Therefore, according to the embodiment, the gain is increased under the low intensity of illumination because the signal is read in the floating diffusion region FD having the lower FD capacitance so that the sensitivity is improved. In contrast, the gain is lowered under the high intensity of illumination because the signal is read in the floating diffusion region FD having the higher FD capacitance so that the sensitivity is reduced. Thus, the image can be realized under the very high intensity of illumination, so that it is possible to provide the pixel having the WDR characteristic, the pixel array, the image sensor, and the method for operating the image sensor.

In addition, different from the related art that provides two photodiodes PD in one pixel, according to the embodiment, one photodiode PD is provided in one pixel, so that the fill factor of the light receiving section can be relatively increased and the sensitivity can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A pixel comprising:
   a photo-electro conversion unit;
   a first capacitor for storing a first quantity of charges of the photo-electro conversion unit;
   a second capacitor for storing a second quantity of charges of the photo-electro conversion unit; and
   an output unit to output the first and second quantities of the charges;
   wherein the first capacitor is connected to a first power supply line and controlled by the first power supply line, and
   wherein the second capacitor is connected to a second power supply line which is controllable independently from the first power supply line, and the second capacitor is controlled by the second power supply line.

2. The pixel of claim 1, further comprising:
   a first reset switching device connected to the first power supply line to reset the first capacitor; and
   a second reset switching device connected to the second power supply line, which is controllable independently from the first power supply line, to reset the second capacitor.

3. The pixel of claim 2, wherein the output unit includes a first output switching device electrically connected between the first capacitor and the first reset switching device to output an electric potential of the first capacitor and a second output switching device electrically connected between the second capacitor and the second reset switching device to output an electric potential of the second capacitor, the first output switching device is controlled by the first power supply line and the second output switching device is controlled by the second power supply line.

4. The pixel of claim 3, further comprising:
   a first transfer switching device for transferring the first quantity of the charges of the photo-electro conversion unit to the first capacitor; and
   a second transfer switching device for transferring the second quantity of the charges of the photo-electro conversion unit to the second capacitor,
   wherein the first capacitor is disposed between the first transfer switching device and the first reset switching device and the second capacitor is disposed between the second transfer switching device and the second reset switching device.

5. The pixel of claim 1, wherein the first capacitor has a first capacitance and the second capacitor has a second capacitance higher than the first capacitance.

6. The pixel of claim 1, wherein the charges are stored in the second capacitor after the charges have been stored in the first capacitor.

7. The pixel of claim 1, wherein the output unit outputs information by combining the quantity of the charges of the first capacitor with the quantity of the charges of the second capacitor.

8. A pixel array including the pixel claimed in claim 1.

9. An image sensor including the pixel array of claim 8.

10. A method for operating an image sensor including a photo-electro conversion unit, a first capacitor for storing a first quantity of charges of the photo-electro conversion unit, a second capacitor for storing a second quantity of charges of the photo-electro conversion unit, and an output unit to output the first and second quantities of the charges, the method comprising:
    controlling the first and second capacitors independently from each other,
    wherein the first capacitor is connected to a first power supply line and controlled by the first power supply line and the second capacitor is connected to a second power supply line, which is controllable independently from the first power supply line, and controlled by the second power supply line.

11. The method of claim 10, wherein the first capacitor is reset by a first reset switching device connected to the first power supply line and the second capacitor is reset by a second reset switching device connected to the second power supply line.

12. The method of claim 11, wherein the output unit includes a first output switching device electrically connected between the first capacitor and the first reset switching device to output an electric potential of the first capacitor and a second output switching device electrically connected between the second capacitor and the second reset switching device to output an electric potential of the second capacitor, the first output switching device is controlled by the first power supply line and the second output switching device is controlled by the second power supply line.

13. The method of claim 10, further comprising:
storing information about the first quantity of the charges generated in the photo-electro conversion unit in the first capacitor having a first capacitance; and
storing information about the second quantity of the charges generated in the photo-electro conversion unit in the second capacitor having a second capacitance.

14. The method of claim 13, wherein the second capacitor has the second capacitance higher than the first capacitance.

15. The method of claim 13, wherein the charges are stored in the second capacitor after the charges have been stored in the first capacitor.

16. The method of claim 13, wherein the output unit outputs information by combining the quantity of the charges of the first capacitor with the quantity of the charges of the second capacitor.

\* \* \* \* \*